United States Patent [19]

Wong et al.

[11] Patent Number: 5,485,292

[45] Date of Patent: Jan. 16, 1996

[54] HIGH VOLTAGE DIFFERENTIAL SENSOR HAVING A CAPACITIVE ATTENUATOR

[75] Inventors: Stephen Wong, Scarsdale; Satyendranath Mukherjee, Yorktown Heights; Naveed Majid, Mohegan Lake, all of N.Y.

[73] Assignee: North American Philips Corporation, New York, N.Y.

[21] Appl. No.: 439,617

[22] Filed: May 12, 1995

Related U.S. Application Data

[63] Continuation of Ser. No. 82,188, Jun. 24, 1993, abandoned.

[51] Int. Cl.$^6$ ............................ G01R 19/00; H03K 5/12; H03K 5/153
[52] U.S. Cl. ........................ 327/56; 327/67; 327/77
[58] Field of Search ........................ 307/355, 360, 307/362, 350, 358; 340/661, 662; 257/777, 308; 327/63, 65, 67, 74, 77, 82, 52, 54, 56, 561, 564, 565

[56] References Cited

U.S. PATENT DOCUMENTS

| | | | |
|---|---|---|---|
| 3,870,926 | 3/1975 | Hughes | 317/12 B |
| 3,988,684 | 10/1976 | Muller et al. | 323/23 |
| 4,028,694 | 6/1977 | Cook et al. | 340/347 AD |
| 4,473,759 | 9/1984 | Mahabadi | 307/355 |
| 4,803,382 | 2/1989 | Tanimoto | 307/355 |
| 4,943,765 | 6/1990 | Dupraz et al. | 324/107 |
| 5,135,883 | 8/1992 | Bae | 257/308 |
| 5,246,439 | 9/1993 | Hebborn | 606/35 |
| 5,282,159 | 1/1994 | Ueda | 257/303 |

FOREIGN PATENT DOCUMENTS

| | | | |
|---|---|---|---|
| 58-92230 | 6/1983 | Japan | 257/777 |
| 62-130551 | 6/1987 | Japan . | |
| 5315562 | 11/1993 | Japan | 257/308 |

OTHER PUBLICATIONS

Microelectronic Circuits pp. 144–145 A. S. Sedra & K. C. Smith HRW Inc., New York, N.Y. 1987.

Primary Examiner—William L. Sikes
Assistant Examiner—Tsep H. Nguyen
Attorney, Agent, or Firm—Steven R. Biren

[57] ABSTRACT

A high-voltage differential sensor includes an attenuator formed of two matched monolithic capacitance divider networks. Each divider network is formed of a series connection of monolithically integrated capacitors, which together generate an attenuated differential signal from a high-voltage differential input signal. The attenuated differential signal from the capacitance divider networks is then amplified and fed to a comparator, which generates a first output level when the high-voltage differential input signal is above a selected level, and generates a second output level when the high-voltage differential input signal is below the selected level. By using monolithically integrated capacitors in the divider networks of the attenuator, a simple, compact, low power, high performance high-voltage differential sensor is obtained.

1 Claim, 1 Drawing Sheet

HIGH VOLTAGE DIFFERENTIAL SENSOR HAVING A CAPACITIVE ATTENUATOR

This is a continuation of application Ser. No. 08/082,188, filed Jun. 24, 1993, now abandoned.

BACKGROUND OF THE INVENTION

This invention is in the field of voltage sensors, and relates more particularly to a high-voltage differential sensor which uses an input attenuator.

High-voltage differential sensors are typically used in circuits such as high-voltage power supply circuits, where it is necessary to sense the voltage difference between two lines, each of which may have a high DC potential and an AC component. In the past, high-voltage differential sensor circuits have typically employed resistive dividers in order to scale down high input voltages to a level that can be safely handled by the voltage sensing circuitry. However, such resistive divider circuits suffer from a number of drawbacks. For example, if large-value resistors are used to minimize power dissipation in the dividers, a significant amount of silicon area must be used to implement the resistors. Alternatively, if smaller-value resistors are used to save space, significant amounts of power will be consumed by the resistive dividers due to the high voltages involved.

Accordingly, it would be desirable to have a high-voltage differential sensor circuit which would avoid the power consumption/area consumption tradeoff inherent in prior-art sensor circuits using resistive dividers. Additionally, it would be desirable to have a sensor circuit which is simple and compact in construction, economical to manufacture, and capable of withstanding high input voltages without breakdown.

SUMMARY OF THE INVENTION

It is thus an object of the invention to provide a high-voltage differential sensor which avoids the power consumption/space consumption tradeoff of prior-art circuits, which is simple and compact in design, and which can accordingly be easily and economically fabricated.

In accordance with the invention, these objects are achieved by a new high-voltage differential sensor which employs an attenuator having matched monolithic capacitive divider networks, with each network including a series connection of matched monolithically integrated capacitors for generating an attenuated differential signal from a high-voltage differential input signal. The differential sensor further includes an amplifier for amplifying the attenuated differential signal and a comparator for generating a first output level when the high-voltage differential input signal is above a selected level, and for generating a second output level when the high-voltage differential input signal is below the selected level.

In a preferred embodiment of the invention, each series connection of monolithically integrated capacitors includes a string of first capacitors each having the same capacitance value connected in series with a second capacitor, with the high-voltage differential input signal being applied between first ends of the two strings of first capacitors, and the attenuated signal being generated between the second capacitors.

In a further preferred embodiment of the invention, the attenuated signal is amplified by two buffer amplifiers, with their outputs being combined in a subtractor, and the output of the subtractor being coupled to a comparator. In an alternative preferred embodiment, the capacitive divider networks are connected to the two amplifiers in an active attenuator configuration, with the outputs of the active attenuators being coupled directly to the comparator, thus accomplishing the same function with a simpler and more economical circuit.

According to yet a further preferred embodiment of the invention, each series connection of monolithically integrated capacitors is formed by a plurality of first polysilicon layer portions and a plurality of at least partly overlapping second polysilicon layer portions, with the first and second polysilicon layer portions being in proximity but electrically insulated from each other by a dielectric layer.

While the prior art shows the use of integrated capacitors connected in series (see U.S. Pat. No. 4,028,694 and Japanese Abstract No. 62-130551), these integrated capacitors typically utilize a diffused region in the underlying silicon body, and the resulting capacitor constructions are not used in a high-voltage differential sensor configuration. Additionally, while circuits are known which use discrete capacitors in a series connection for voltage division (see U.S. Pat. Nos. 3,870,926 and 3,988,684) and use capacitors in connection with amplifiers (See U.S. Pat. No. 4,943,765), the prior art neither shows nor suggests a high-voltage differential sensor using attenuators having matched monolithic capacitive divider networks.

BRIEF DESCRIPTION OF THE DRAWING

The invention may be more completely understood with reference to the following detailed description, to be read in conjunction with the accompanying drawing, in which.

DESCRIPTION OF THE PREFERRED EMBODIMENTS

Figure 1:
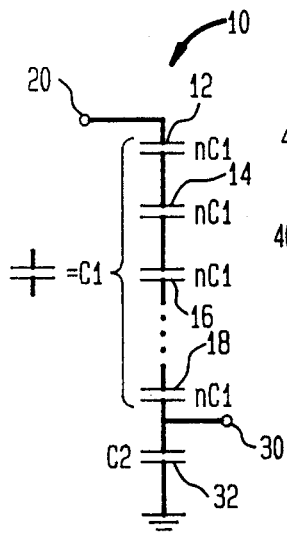
FIG. 1 shows a schematic diagram of a capacitive divider network for use in the high-voltage differential sensor of the invention.

A capacitive divider network for use in the attenuator portion of a high-voltage differential sensor in accordance with the invention is shown schematically in FIG. 1. The capacitive divider network 10 includes a series connection of a desired number of capacitors, with the string of capacitors being represented by capacitors 12, 14, 16 and 18, and with the dotted line between capacitor 16 and 18 being used to show that more (or fewer) capacitors can be employed. This series string of capacitors is connected between an input terminal 20 and an output terminal 30, with a second capacitor 32 being connected between the output terminal and a further terminal, here ground. With a number n of first capacitors, each first capacitor having a capacitance value of $nC_1$, then the equivalent capacitance of the capacitor string between terminals 20 and 30 will be $C_1$. In FIG. 1 and subsequent figures, the equivalent capacitance value $C_1$ is shown for simplicity as a single capacitor having thickened plates.

The capacitive divider of FIG. 1 serves to attenuate an input voltage appearing at terminal 20 in accordance with the ratio between C1 and (C1+C2), with the attenuated output voltage appearing at the output terminal 30. In practice, a high voltage will be applied to terminal 20, and most of this voltage will appear across equivalent capacitance C1, in order to achieve a significant attenuation ratio. Accordingly, by forming capacitance C1 from a number n of capacitors each having a capacitance value nC1, the voltage across each individual capacitor will be 1/n times the total voltage appearing across the capacitor string. This distribution of the high input voltage among the several capacitors connected between terminals 20 and 30 is important because when the capacitors are implemented in monolithically integrated form, the breakdown voltage of each individual capacitor will be relatively low, whereas the capacitive divider network must be capable of withstanding voltages as high as several hundred volts at the input terminal 20. The precise values of capacitors nC1 and C2, as well as the number of capacitors n, will be selected in accordance with the desired operating parameters, such as the expected maximum input voltage, the attenuation ratio desired, the breakdown voltage of the individual capacitors used, and the like, as will be apparent to those of ordinary skill in the art.

Figure 2:
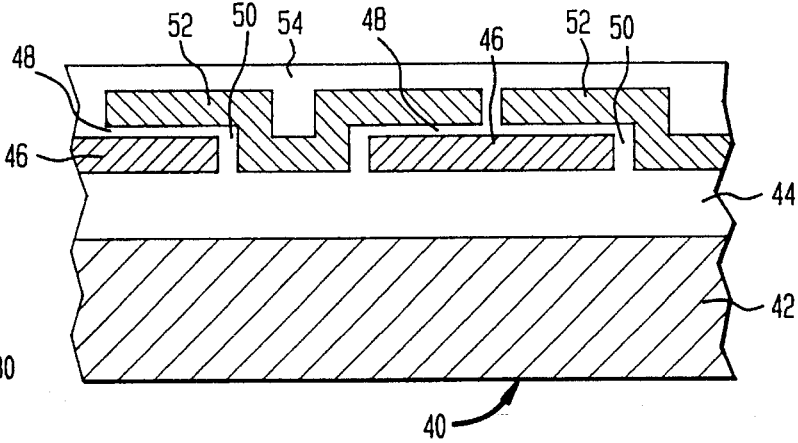
FIG. 2 shows a partial cross-sectional view of a structure having series-connected monolithically integrated capacitors for use in the capacitor divider network of FIG. 1.

FIG. 2 shows a partial cross-sectional view of a structure having series-connected monolithically integrated capacitors suitable for use in the capacitor divider network 10 of FIG. 1. Structure 40, which may be part of an integrated circuit device, has a substrate 42, typically of silicon, with an overlying field oxide 44. Above the field oxide 44 are formed first polysilicon regions 46, which are electrically insulated by gate oxide regions 48 on their upper horizontal surfaces and by inter-electrode oxide regions 50 on their vertical side surfaces. Second polysilicon region portions 52 are located in proximity to the first polysilicon regions 46 in a partly-overlapping configuration to efficiently create the desired string of series capacitances in monolithic integrated form, with oxide regions 48 and 50 serving as a dielectric between the capacitor plates. A passivation oxide layer 54 is provided over the polysilicon regions to complete the monolithically integrated capacitor structure. It should be noted that FIG. 2 is not drawn to scale, and that certain dimensions may be exaggerated for the purpose of clarity.

The structure shown in FIG. 2 offers several important advantages when used in a high-voltage integrated sensor. First, capacitors of this type can be accurately matched and have a low voltage coefficient (i.e. change in capacitance with change in voltage), so that high accuracy is insured. Additionally, by using two partly overlapping polysilicon layers separated by oxide, as shown, it is possible to implement an entire string of capacitors without any extra contacts or interconnections between the capacitors, thus providing a simple and compact structure. Furthermore, since the entire capacitive structure is located over the silicon substrate 42, the silicon area underneath the capacitance structure may be used for other purposes, thus achieving a still more compact design. It should also be noted that although the gate oxide 48 is typically quite thin, and thus has a relatively low breakdown voltage, this configuration can be used in the capacitive divider circuit (which typically receives a high-voltage input) because the input voltage is divided among a sufficient number n of capacitors such that each individual capacitor receives only a relatively low voltage. Furthermore, because no DC current flows in the capacitive network, power consumption in the circuit is minimized, and the tradeoff between area and power consumption inherent in prior-art resistive divider designs is avoided. Additionally, because standard MOS technology is used, the fabrication process is both simple and economical.

Figure 3:
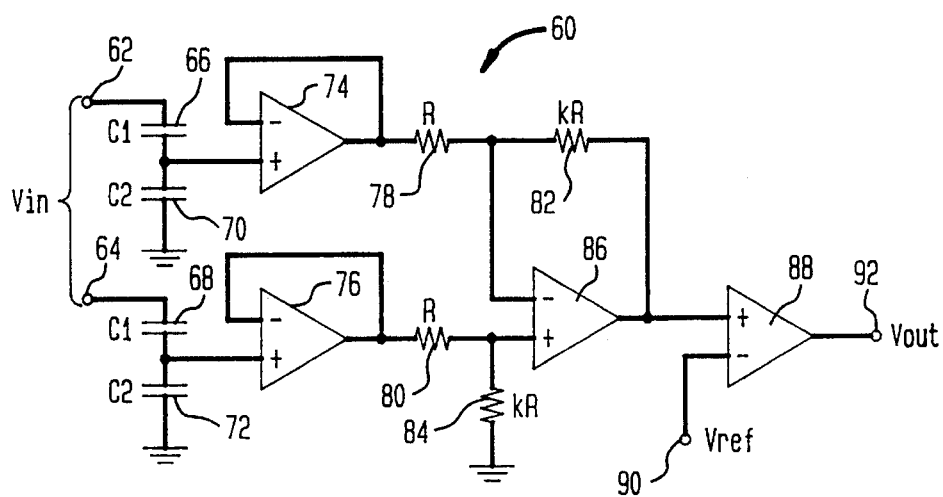
FIG. 3 shows a first embodiment of a high-voltage differential sensor circuit in accordance with the invention.

FIG. 3 shows a first embodiment of a high-voltage differential sensor circuit 60 using a capacitive divider network in accordance with FIGS. 1 and 2. A high-voltage input Vin is applied across differential input terminals 62 and 64, with each input terminal being connected to a capacitive divider network as shown in FIG. 1. The two divider networks each have a matched series string of capacitors, schematically represented by single capacitors 66 and 68 with thickened plates, with each capacitor string having an equivalent value C1. The other ends of equivalent capacitors 66 and 68 are connected, respectively, to capacitors 70 and 72, each having a value C2, and also to the noninverting inputs of operational amplifiers 74 and 76, respectively. Input terminals 62 and 64 will typically receive an input voltage of several hundred volts, with both an A.C. and a D.C. component, with the difference between the voltages at these two terminals constituting the differential input voltage Vin. In one application of this circuit, the voltage Vin may be derived from a power-supply rectifier circuit, with the circuit of the invention being used to monitor the rectifier output voltage and generate an appropriate control signal as a function of the differential voltage being measured. The outputs of operational amplifiers 74 and 76, used here as buffer amplifiers, are coupled to a subtractor circuit composed of resistors 78, 80, 82 and 84, and operational amplifier 86. The gain of the subtractor stage is determined by the ratio k between resistors 82 (or 84) of resistance kR and 78 (or 80) of resistance R. The output of the subtractor stage is coupled to the noninverting input of a comparator 88, with the inverting input of the comparator being connected to terminal 90, which receives a reference voltage Vref, and the circuit output Vout is provided at an output terminal 92 of the comparator 88.

In operation, the differential sensor circuit 60 will receive a differential input voltage Vin across terminals 62 and 64. Due to the differential nature of the input connections, any common-mode component of the voltages at input terminals 62 and 64 will automatically be cancelled. The voltages at input terminals 62 and 64 are then attenuated in the ratio of C1 to (C1+C2) by the capacitive divider networks 66, 70 and 68, 72, respectively. The attenuated voltages from the voltage dividers are then feed to the non-inverting inputs of buffer amplifiers 74 and 76, and then to a subtractor stage having an gain of k. The output of this subtractor stage, which is proportional to the difference between the voltages at input terminals 62 and 64 (i.e. Vin) is then fed to the non-inverting input of comparator 88, with a reference signal Vref applied to the inverting input 90 of the comparator. The value of the voltage Vref is selected such that the comparator 88 will generate a change in output state at terminal 92 (Vout) when the differential input voltage Vin is equal to or greater than a desired value.

Figure 4:
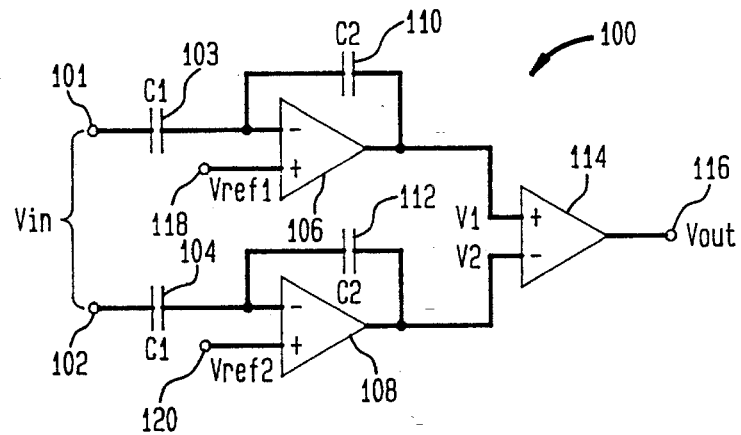
FIG. 4 shows a second embodiment of a high-voltage differential sensor circuit in accordance with the invention.

A second embodiment of a high-voltage differential sensor circuit 100 is shown in FIG. 4. In this embodiment, the differential input voltage Vin is applied across input terminals 101, 102 to the capacitor strings 103 and 104 (each of equivalent capacitance C1), but in this embodiment operational amplifiers 106 and 108 are combined with the capacitive divider networks in an active attenuator configuration, with capacitor 110 being connected from the inverting input to the output of operational amplifier 106 and capacitor 112 being connected from the inverting input to the output of operational amplifier 108. The outputs of operational amplifiers 106 and 108 are coupled to the inverting and non-inverting inputs, respectively, of comparator 114, and are designated as voltages V1 and V2, respectively. The circuit output Vout is taken from output terminal 116 of the comparator 114.

Comparing the circuit of FIG. 4 to that of FIG. 3, it can be seen that, by combining the capacitive divider networks with the operational amplifiers to obtain active attenuators, the resulting circuit is substantially simplified. More particularly, the circuit of FIG. 4 uses one less amplifier and four less resistors than the circuit of FIG. 3, thus affording a simpler, more compact and more economically design. By combining the capacitive dividers with the operational amplifiers, and providing two reference signals Vref1 and Vref2 to the non-inverting terminals 118 and 120 of amplifiers 106 and 108, respectively, attenuated, buffered voltages V1 and V2 are obtained, which can be directly applied to the inputs of comparator 114, thus avoiding the necessity of a subtractor circuit as shown in FIG. 3. In operation, the comparator will change states when the value of voltage V1 goes from greater than that of V2 to less than that of V2, with the transition point being determined by the relative values of capacitors Cl and C2 and the values of Vref1 and Vref2. Thus, the circuit of FIG. 4 provides a comparable function to that of FIG. 3, namely, the attenuation of a high-voltage differential input signal and the provision of an output signal which changes state when the differential input signal exceeds a predetermined value. However, the circuit of FIG. 4 accomplishes this function with fewer components, and is therefore simpler, more compact, and more economical to manufacture.

While the invention has been particularly shown and described with reference to a preferred embodiment thereof, it will be understood by those skilled in the art that various changes in form and detail may be made without departing from the spirit and scope of the invention.

We claim:

1. A high-voltage differential sensor, which comprises:

attenuator means having two matched monolithic capacitive divider networks, each network comprising a series connection of a plurality of matched monolithically integrated capacitors, for generating an attenuated differential signal from a high-voltage differential input signal;

amplifier means for amplifying said attenuated differential signal; and comparator means for generating a first output level when said high-voltage differential input signal is above a selected level, and for generating a second output level when said high-voltage differential input signal is below said selected level;

wherein each said series connection of monolithically integrated capacitors comprises a string of at least two first capacitors each having a same capacitance value connected in series with a second capacitor at a first end of said second capacitor, said high-voltage differential input signal being applied between first ends of said strings of first capacitors, and the attenuated signal being generated between said first ends of said second capacitors;

wherein each series connection of monolithically integrated capacitors is formed by a plurality of first polysilicon layer portions and a plurality of at least partially overlapping second polysilicon layer portions, said first and second polysilicon layer portions being located entirely above a semiconductor substrate and insulated therefrom, being in proximity to each other, and being electrically insulated from each other by a dielectric layer;

wherein said amplifier means comprises two amplifiers, each having an input coupled to said first end of one of said second capacitors, and an output connected to a second end of one of said second capacitors and an input of said comparator means; and wherein said two amplifier-outputs are connected directly to said comparator means, and a second end of each of said second capacitors is coupled to the output of its respective amplifier, said amplifier means and said attenuator means together forming an active attenuator circuit.

* * * * *